(12) United States Patent
Liu et al.

(10) Patent No.: US 11,486,054 B2
(45) Date of Patent: Nov. 1, 2022

(54) METHOD FOR GROWING CRYSTAL BOULE

(71) Applicant: Fujian Jing'an Optoelectronics Co., Ltd., Fujian (CN)

(72) Inventors: Qiankun Liu, Fujian (CN); Fan Qi, Fujian (CN); Fengbo Wu, Fujian (CN); Jianyun Yu, Fujian (CN); Pin-Hui Hsieh, Fujian (CN)

(73) Assignee: Fujian Jing'an Optoelectronics Co., Ltd., Fujian (CN)

( * ) Notice: Subject to any disclaimer, the term of this patent is extended or adjusted under 35 U.S.C. 154(b) by 111 days.

(21) Appl. No.: 16/817,142

(22) Filed: Mar. 12, 2020

(65) Prior Publication Data
US 2020/0208293 A1 Jul. 2, 2020

Related U.S. Application Data

(63) Continuation-in-part of application No. PCT/CN2018/087459, filed on May 18, 2018.

(30) Foreign Application Priority Data

Sep. 15, 2017 (CN) .......................... 201710830008.4

(51) Int. Cl.
*C30B 15/10* (2006.01)
*C30B 15/00* (2006.01)
(Continued)

(52) U.S. Cl.
CPC ............ *C30B 15/002* (2013.01); *C30B 15/00* (2013.01); *C30B 15/10* (2013.01); *C30B 15/20* (2013.01); *C30B 15/22* (2013.01)

(58) Field of Classification Search
CPC ....... C30B 15/002; C30B 15/10; C30B 15/22; C30B 15/00; C30B 15/20
See application file for complete search history.

(56) References Cited

U.S. PATENT DOCUMENTS 6,423,135 B1 * 7/2002 Akashi .................... C30B 15/22
117/13
2003/0209186 A1 * 11/2003 Haga ....................... C30B 29/06
117/13

(Continued)

FOREIGN PATENT DOCUMENTS

| CN | 1724722 A | 1/2006 |
|---|---|---|
| CN | 102268726 A | 12/2011 |

(Continued)

OTHER PUBLICATIONS

World Intellectual Property Organization, "International Search Report" and "Written Opinion of the International Searching Authority" and English translation thereof, issued in International Application No. PCT/CN2018/087459, document of 17 pages, dated Aug. 24, 2018.

(Continued)

*Primary Examiner* — Matthew J Song
(74) *Attorney, Agent, or Firm* — Akerman LLP; Peter A. Chiabotti

(57) ABSTRACT

A method for growing a crystal boule includes the steps of: periodically pulling upwardly a seed crystal dipped into a melt in a crucible to grow a first neck of the crystal boule below the seed crystal; and continuously pulling upwardly the seed crystal and the first neck of the crystal boule to grow a second neck of the crystal boule below the first neck.

15 Claims, 2 Drawing Sheets

Periodic seeding

Continuous seeding

Combination of periodic and continuous seeding

(51) Int. Cl.
    *C30B 15/22*     (2006.01)
    *C30B 15/20*     (2006.01)

(56) References Cited

U.S. PATENT DOCUMENTS

| | | | | |
|---|---|---|---|---|
| 2006/0005761 | A1* | 1/2006 | Kulkarni | C30B 15/30 |
| | | | | 117/15 |
| 2009/0260564 | A1* | 10/2009 | Saito | C30B 29/06 |
| | | | | 117/35 |
| 2012/0067272 | A1* | 3/2012 | Banba | C30B 15/30 |
| | | | | 117/15 |

FOREIGN PATENT DOCUMENTS

| | | | |
|---|---|---|---|
| CN | 104109904 | A | 10/2014 |
| CN | 104451862 | A | 3/2015 |
| CN | 104674345 | A | 6/2015 |
| CN | 204849124 | U | 12/2015 |
| CN | 105506738 | A | 4/2016 |
| CN | 107653489 | A | 2/2018 |
| JP | H0782087 | A | 3/1995 |
| RU | 2248418 | C1 | 3/2005 |

OTHER PUBLICATIONS

Chinese Intellectual Property Office, "Search Report" and English language translation thereof, issued in Chinese Patent Application No. 2017108300084 dated Aug. 21, 2019, document of 2 pages.

* cited by examiner

| Diameter increase (mm) | 15~20 Sub-step (A1) | 20~25 Sub-step (A2) | 25~50 Step (B) | 50~ Self-crystallization |
|---|---|---|---|---|
| Diameter growth rate (mm/min) | 0.4 | 0.25 | 0.083 | |
| Weight increase rate (g/min) | 0.04 | 0.05 | 0.05 | |
| Pulling time interval (min) | 5 | 8 | | |

FIG.3

METHOD FOR GROWING CRYSTAL BOULE

CROSS-REFERENCE TO RELATED APPLICATION

This application is a continuation-in-part application of PCT International Application No. PCT/CN2018/087459 filed on May 18, 2018, which claims priority of Chinese Invention Patent Application No. 201710830008.4, filed on Sep. 15, 2017. The content of each of the international and Chinese patent applications is incorporated herein by reference.

FIELD

The present disclosure relates to a method for growing a crystal boule, and more particularly to a method for growing a crystal boule by periodic and continuous seeding techniques.

BACKGROUND

A conventional method for growing a crystal boule is to use periodic seeding technique or continuous seeding technique. During periodic seeding process, a seed crystal is periodically pulled at a fixed time interval to grow to a predetermined thickness according to the growth size thereof (see upper-left corner of FIG. 1). The periodic seeding process may cause severe fluid disturbance which affects heat transfer at the crystal growth interface resulting in temperature fluctuations. The temperature fluctuation will adversely impede the release of air bubbles formed during the periodic seeding process, which in turn lowers the seeding quality. Alternatively, the crystal boule might be grown using continuous seeding technique. During continuous seeding process, the seed crystal is continuously pulled at a fixed pulling rate according to the growth size thereof (see upper-right corner of FIG. 1. Since fluid disturbance in the continuous seeding process is relatively small, air bubbles can be released more effectively, as compared to the periodic seeding technique. However, growth rate of the crystal boule is slow, which inevitably incur high cost of manufacturing equipment and manpower.

SUMMARY

Therefore, an object of the present disclosure is to provide a method for growing a crystal boule, which can alleviate at least one of the drawbacks of the prior art.

According to the present disclosure, a method for growing a crystal boule includes the steps of:

(A) periodically pulling upwardly a seed crystal dipped into a melt in a crucible to grow a first neck of the crystal boule below the seed crystal; and (B) continuously pulling upwardly the seed crystal and the first neck of the crystal boule to grow a second neck of the crystal boule below the first neck.

BRIEF DESCRIPTION OF THE DRAWINGS

Other features and advantages of the present disclosure will become apparent in the following detailed description of the embodiments with reference to the accompanying drawings, of which:

FIG. 3 shows the exemplified parameter values used in the method of this disclosure.

DETAILED DESCRIPTION

For the purpose of this specification, it will be clearly understood that the word "comprising" means "including but not limited to", and that the word "comprises" has a corresponding meaning.

Unless otherwise defined, all technical and scientific terms used herein have the meaning commonly understood by a person skilled in the art to which this disclosure belongs. One skilled in the art will recognize many methods and materials similar or equivalent to those described herein, which could be used in the practice of this disclosure. Indeed, this disclosure is in no way limited to the methods and materials described.

Figure 1:
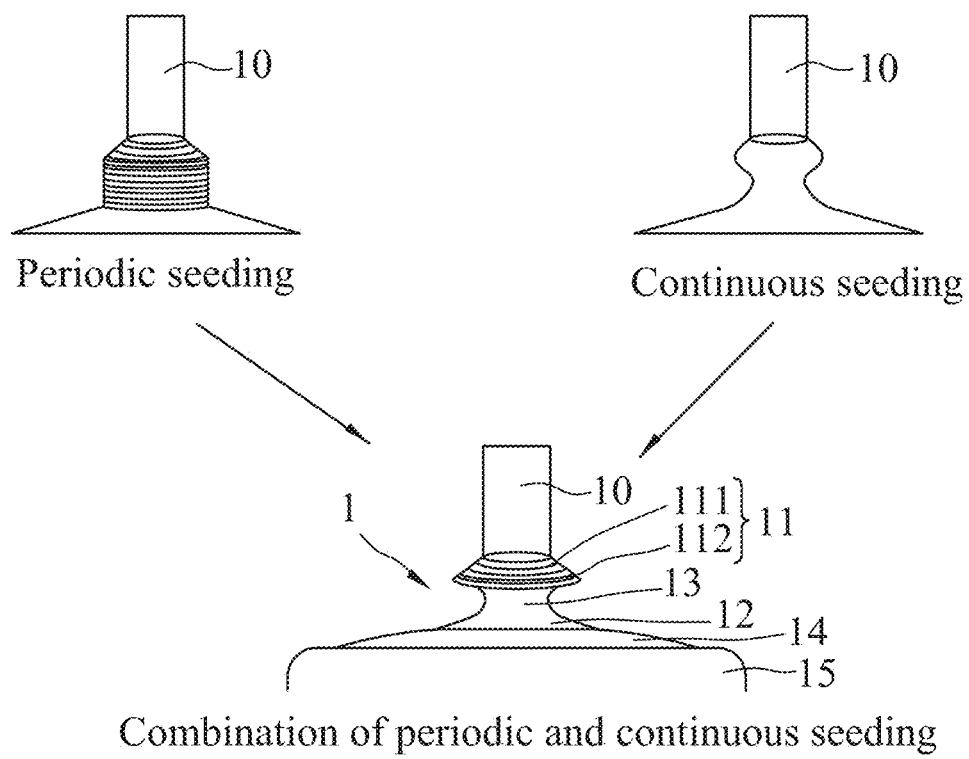
FIG. 1 is a schematic view showing a crystal boule made by a method for growing a crystal boule according to the present disclosure.
Figure 2:
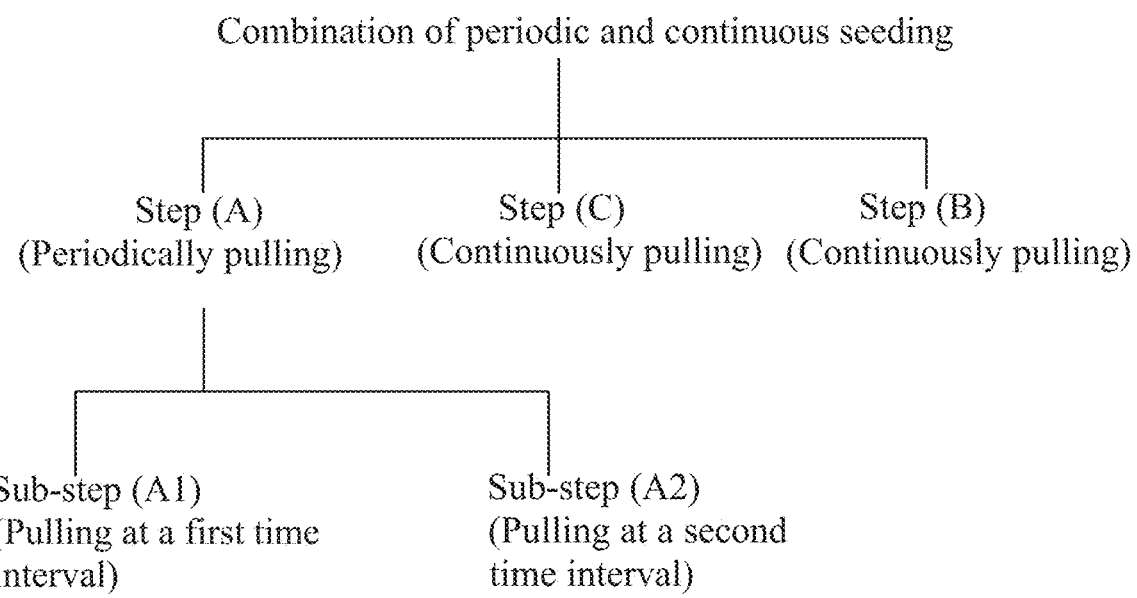
FIG. 2 is a diagram illustrating the method of this disclosure.

Referring to FIGS. 1 and 2, a method for growing a crystal boule 1 according to the present disclosure includes step (A) involving periodic seeding technique and step (B) involving continuous seeding technique. In other words, the method of the present disclosure combines these conventional techniques to improve the growth quality of the crystal boule 1. To be specific, in step (A), a seed crystal 10 dipped into a melt in a crucible is periodically pulled upwardly to grow a first neck 11 of the crystal boule 1 below the seed crystal 10.

As used herein, the term "periodically" can be used interchangeably with the term "discontinuously" or "intermittently", and indicates that a step or operation is repeatedly performed at regular or irregular intervals or a combination of both regular and irregular intervals.

In certain embodiments, the first neck 11 of the crystal boule 1 has a diameter that increases along a direction away from the seed crystal 10. In an exemplary embodiment as shown in FIG. 3, the diameter of the first neck 11 increases from 15 mm to 25 mm, in such manner that crystal defects and impurities, which are usually formed during the conventional periodic seeding process conducted for a long time period at low temperature, can be reduced while ensuring the growth rate of the crystal boule 1 is in a desired range.

In certain embodiments, step (A) includes sub-steps (A1) and (A2). In sub-step (A1), the seed crystal 10 is pulled upwardly at a first time interval to grow an upper portion 111 below the seed crystal 10. In sub-step (A2), the seed crystal 10 and the upper portion 111 are pulled upwardly at a second time interval that is different from the first time interval to grow a lower portion 112 below the first portion 111. The first neck 11 includes the upper and lower portions 111, 112.

The upper portion 111 may have a thickness substantially equal to that of the lower portion 112. In other words, sub-steps (A1) and (A2) may be conducted to allow the seed crystal 10 to be pulled upwardly a fixed distance.

In sub-steps (A1), the upper portion 111 may be grown at a diameter growth rate that ranges from 0.3 mm/min to 0.5 mm/min. The upper portion 111 may be grown at a weight increase rate that ranges from 0.035 g/min to 0.045 g/min. The first time interval may range from 4.5 min to 5.5 min.

In sub-steps (A2), the lower portion 112 may be grown at a diameter growth rate that ranges from 0.2 mm/min to 0.3 mm/min. The lower portion 112 may be grown at a weight increase rate that ranges from 0.045 g/min to 0.055 g/min. The second time interval may range from 7.5 min to 8.5 min.

It should be noted that, the diameter growth rate of the lower portion 112 of the first neck 11 is similar but slightly slower than that of the upper portion 111, indicating sub-step (A2) is conducted at a relatively high temperature to eliminate crystal defects without adversely affecting the diameter growth rate thereof.

In an exemplary embodiment shown in FIG. 3, the upper portion 111 is grown at a diameter growth rate of 0.4 mm/min and at a weight increase rate of 0.040 g/min. The lower portion 112 is grown at a diameter growth rate of 0.25 mm/min and at a weight increase rate of 0.050 g/min. The sub-steps (A1) and (A2) are periodically performed at the first time interval of 5.0 min and at the second time interval of 8.0 min, respectively. In addition, the upper portion 111 has a diameter that increases from 15 mm to 20 mm along a direction away from the seed crystal 10, and the lower portion 112 has a diameter that increases from 20 mm to 25 mm along a direction away from the upper portion 111.

In step (B), the seed crystal 10 and the first neck 11 of the crystal boule 10 are continuously pulled upwardly to grow a second neck 12 of the crystal boule 1 below the first neck 11.

In certain embodiments, the second neck 12 of the crystal boule 1 has a diameter that increases along a direction away from the first neck 11. In an exemplary embodiment shown in FIG. 3, the second neck 12 has a diameter that increases from 25 mm to 50 mm along a direction away from the seed crystal 10.

The second neck 12 may be grown at a diameter growth rate that ranges from 0.081 mm/mm to 0.085 mm/min. In an exemplary embodiment shown in FIG. 3, the second neck 12 is grown at a diameter growth rate of 0.083 mm/min.

The second neck 12 may be grown at a weight increase rate that ranges from 0.045 g/min to 0.055 g/min. In an exemplary embodiment shown in FIG. 3, the second neck 12 is grown at a weight increase rate of 0.050 g/min.

The method of the present disclosure may further include step (C) involving continuous seeding technique that is performed between steps (A) and (B), in which the seed crystal 10 and the first neck 11 of the crystal boule 1 is continuously pulled upwardly to grow a third neck 13 of the crystal boule 1 between the first and second necks 11, 12.

The third neck 13 has a diameter that decreases along a direction from the first neck 11 to the second neck 12. In certain embodiments, the third neck 13 is grown at a diameter decrease rate that ranges from 0.167 mm/min to 0.33 min/min.

Taking FIG. 3 as an example, after sub-step (A2), step (C) may be conducted to grow the third neck 13 having the diameter decreasing from 25 mm to 20 mm along a direction from the first neck 11 to the second neck 12, and then step (B) is conducted to grow the second neck 12 having the diameter increasing from 20 mm to 50 mm along a direction away from the third neck 13. In addition, during step (C), the third neck 13 may be grown at a diameter decrease rate of 0.167 mm and at a weight decrease rate of 0.375 g/min.

In certain embodiments, a heating power ranging from 150 W to 250 W is provided in step (C) to heat the crucible. In an exemplary embodiment, the seed crystal 10 and the first neck 11 of the crystal boule 1 is pulled upwardly for a time period that ranges from 20 min to 40 min after the heating power is provided.

In certain embodiments, step (C) is conducted at a temperature higher than that in step (A). The higher the crystallization temperature is, the smaller the diameter growth rate of the growing crystal is. Therefore, by conducting step (C), crystal defects and/or impurities that might be formed in step (A) can be effectively reduced.

After step (B), self-crystallization process may be allowed to proceed so as to grow a shoulder 14 and a body 15 of the crystal boule 1 below the second neck 12. That is, the growth of the shoulder 14 proceeds after a maximum diameter of the second neck 12 is obtained. Similarly, the growth of the body 15 below the shoulder 14 proceeds after a maximum diameter of the shoulder is obtained. The shoulder 14 has an increased diameter along a direction away from the second neck 12, and the body 15 has a diameter substantially equal to the maximum diameter of the shoulder 14. Since crystal defects are reduced by conducting step (C), the driving force for the self-crystallization process (i.e., subcooling degree) mainly stems from heat dissipation of the crystal boule 1. Therefore, during the self-crystallization process, a surface area of the shoulder 14 and the body 15 of the crystal boule 1 is enlarged for dissipating heat and maintaining the amount of the thus dissipated heat by virtue of, e.g., controlling parameters of the diameter growth rate, so as to allow the self-crystallization process to proceed and prevent the shoulder 14 and the body 15 of the crystal boule 1 from melting after crystallization, thereby ensuring stable growth of the crystal boule 1.

To sum up, by combining the periodic seeding technique and continuous seeding technique (i.e., periodically pulling the seed crystal 10 followed by continuous pulling, the method of this disclosure is capable of growing a crystal boule 1 having improved quality in an efficient manner.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment" "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method for growing a crystal boule, comprising the steps of:
   (A) periodically and intermittently pulling upwardly a seed crystal dipped into a melt in a crucible to grow a first neck of the crystal boule below the seed crystal;
   (B) continuously pulling upwardly the seed crystal and the first neck of the crystal boule to grow a second neck of the crystal boule below the first neck; and
   after step (B), growing a shoulder and a body of the crystal boule below the second neck, wherein step (A) includes the sub-steps of:
   (A1) pulling upwardly the seed crystal at a first time interval to grow an upper portion below the seed crystal at a diameter growth rate that ranges from 0.3 mm/min to 0.5 mm/min and at a weight increase rate that ranges from 0.035 g/min to 0.045 g/min, and (A2) pulling upwardly the seed crystal and the upper portion at a second time interval different from the first time interval to grow a lower portion below the upper portion at a diameter growth rate that ranges from 0.2 mm/min to 0.3 mm/min and at a weight increase rate that ranges from 0.045 g/min to 0.055 g/min, the first neck including the upper and lower portions, the diameter growth rate of the upper portion being greater than that of the lower portion.

2. The method as claimed in claim 1, wherein in step (A), the first neck of the crystal boule has a diameter increasing along a direction away from the seed crystal.

3. The method as claimed in claim 2, wherein in step (A), the diameter of the first neck increases from 15 mm to 25 mm.

4. The method as claimed in claim 1, wherein the upper portion has a thickness substantially equal to that of the lower portion.

5. The method as claimed in claim 1, wherein the upper portion has a diameter increasing from 15 mm to 20 mm along a direction away from the seed crystal, and the lower portion has a diameter increasing from 20 mm to 25 mm along a direction away from the upper portion.

6. The method as claimed in claim 1, wherein in sub-step (A1), the first time interval ranges from 4.5 min to 5.5 min.

7. The method as claimed in claim 1, wherein in sub-step (A2), the second time interval ranges from 7.5 min to 8.5 min.

8. The method as claimed in claim 1, further comprising between steps (A) and (B), a step (C) of continuously pulling upwardly the seed crystal and the first neck of the crystal boule to grow a third neck of the crystal boule between the first and second necks, the third neck having a diameter decreasing along a direction from the first neck to the second neck.

9. The method as claimed in claim 8, wherein in step (C), the third neck is grown at a diameter decrease rate that ranges from 0.167 mm/min to 0.333 mm/min.

10. The method as claimed in claim 8, wherein in step (C), a heating power is provided to heat the crucible and ranges from 150 W to 250 W.

11. The method as claimed in claim 8, wherein step (C) is conducted at a temperature higher than that in step (A).

12. The method as claimed in claim 10, wherein in step (C), pulling upwardly the seed crystal and the first neck of the crystal boule is conducted for a time period ranging from 20 min to 40 min after the heating power is provided.

13. The method as claimed in claim 1, wherein in step (B), the second neck has a diameter increasing from 25 mm to 50 mm along a direction away from the seed crystal.

14. The method as claimed in claim 1, wherein in step (B), the second neck is grown at a diameter growth rate that ranges from 0.081 mm/min to 0.085 mm/min.

15. The method as claimed in claim 1, wherein in step (B), the second neck is grown at a weight increase rate that ranges from 0.045 g/min to 0.055 g/min.

* * * * *